US005789919A

United States Patent [19]

Umemoto et al.

[11] Patent Number: 5,789,919

[45] Date of Patent: Aug. 4, 1998

[54] MAGNETORESISTANCE SENSING DEVICE WITH INCREASED MAGNETIC FIELD DETECTION EFFICIENCY

[75] Inventors: Hideki Umemoto; Naoki Hiraoka; Wataru Fukui; Yutaka Ohashi; Masahiro Yokotani, all of Tokyo, Japan

[73] Assignee: Mitsubishi Denki Kabushiki Kaisha, Tokyo, Japan

[21] Appl. No.: 741,690

[22] Filed: Oct. 31, 1996

[30] Foreign Application Priority Data

Jun. 10, 1996 [JP] Japan .................................... 8-147555

[51] Int. Cl.[6] ............................ G01B 7/14; G01R 33/06; F02B 53/06

[52] U.S. Cl. .................. 324/207.21; 324/252; 338/32 R

[58] Field of Search .............................. 324/207.21, 252, 324/207.25, 207.24, 174; 338/32 R

[56] References Cited

U.S. PATENT DOCUMENTS 5,475,304 12/1995 Prinz .................................. 324/207.21
5,477,143 12/1995 Wu ...................................... 324/207.21

OTHER PUBLICATIONS

*Journal of Magnetics Society of Japan*, vol. 15, No. 5, 1991, pp. 813 to 820 (no translation).

*Primary Examiner*—Walter E. Snow
*Attorney, Agent, or Firm*—Sughrue, Mion, Zinn, Macpeak & Seas, PLLC

[57] ABSTRACT

The invention provides a sensing device capable of outputting a high-accuracy signal precisely corresponding to a particular position (angle) of a rotating member made of a magnetic material without being disturbed by external noise. The sensing device includes: a magnet for generating a magnetic field; a rotating member made of a magnetic material, for changing the magnetic field generated by the magnet, the rotating member being disposed a predetermined distance apart from the magnet; and a giant magnetoresistance device whose resistance changes in response to the change in the magnetic field caused by the rotating member of magnetic material, wherein the size $L_3$ of the magnetic field sensing plane of the giant magnetoresistance device is set to a value less than the smallest value of the dimensions $L_1$ and $L_2$ of the protruding and recessed portions of the rotating member of magnetic material, that is, the size $L_3$ of the magnetic field sensing plane is set so that the following conditions are satisfied: $L_3 \leqq L_1$ and $L_3 \leqq L_2$.

10 Claims, 15 Drawing Sheets

(a) $\begin{cases} L_{B3} = \frac{1}{2}L_1 \\ L_{B3} = \frac{1}{2}L_2 \end{cases}$ (b) $\begin{cases} L_3 = \frac{2}{3}L_1 \\ L_3 = \frac{2}{3}L_2 \end{cases}$ (c) $\begin{cases} L_3 = L_1 \\ L_3 = L_2 \end{cases}$ (d) $\begin{cases} L_3 > L_1 \\ L_3 > L_2 \end{cases}$ (a)

(b)

MAGNETORESISTANCE SENSING DEVICE WITH INCREASED MAGNETIC FIELD DETECTION EFFICIENCY

BACKGROUND OF THE INVENTION

1. Field of the Invention

The present invention relates to a sensing device for detecting the change in a magnetic field caused by the motion of a moving member of magnetic material, and more particularly, to a sensing device which is particularly suitable for detecting information about the rotation of for example an internal combustion engine.

2. Description of the Related Art

Magnetoresistance devices generally refer to those devices which change in resistance in response to the direction of a magnetic field applied to a thin ferromagnetic film with respect to the direction of a current flowing through the thin ferromagnetic film.

Magnetoresistance devices have-minimum resistance when a magnetic field is applied in a direction at a right angle to the direction of current. On the other hand, when the angle between the direction of the current and the direction of the applied magnetic field is 0, that is when a magnetic field is applied in a direction the same as or opposite to the direction of current, the resistance has a maximum value. The change in the resistance is generally called the magnetoresistance effect, and the magnitude of the change in the resistance is referred to as the magnetoresistance variation ratio. A typical value of magnetoresistance variation ratio is 2 to 3% for Ni—Fe and 5 to 6% for Ni—Co.

FIG. 21 is a schematic diagram illustrating the construction of a conventional sensing device, wherein its side view and perspective view are shown in FIG. 21*a* and FIG. 21*b*, respectively.

The sensing device shown in FIG. 32 includes: a rotating shaft 1; a rotary member of magnetic material 2 having at least one protruding or recessed portion wherein the rotary member of magnetic material 2 is adapted to rotate in synchronization with the rotation of the rotating shaft 1; a magnetoresistance device 3 disposed at a location a predetermined distance apart from the rotary member of magnetic material 2; and a magnet 4 for applying a magnetic field to the magnetoresistance device 3. In the above construction, the magnetoresistance device 3 includes a magnetoresistance pattern **3*a* and a thin film surface (magnetic field sensing plane) 3*b***.

If the rotary member of magnetic material 2 rotates, the magnetic field applied to the magnetic field sensing plane **3*b* of the magnetoresistance device 3 changes in response to the rotation of the rotary member of magnetic material 2, and, as a result, the resistance of the magnetoresistance pattern 3*a*** changes correspondingly.

FIG. 22 is a circuit diagram of the conventional sensing device. The magnetoresistance device 3 connected to a constant current source produces a voltage signal Svv which varies in response to the passage of the projecting and recessed portions of the rotary member of magnetic material 2.

The conventional sensing device has various disadvantages as described below.

The magnetoresistance device employed in the conventional sensing device generally has a single-layer structure consisting of a thin ferromagnetic film. In this structure, the resistance varies depending on the angle between the applied magnetic field and the current. In other words, the magnetic field sensing plane has anisotropic sensitivity to magnetic field.

Furthermore, the conventional sensing device has the following disadvantages: small variation in resistance due to utilization of a single magnetoresistance device, and accordingly low sensitivity to the change in magnetic field; accordingly low output voltage; unreliable operation due to the tendency to be easily disturbed by external noise which often overwhelms an intrinsic signal component representing the motion of the protruding and recessed portions of the rotary member of magnetic material.

It is an object of the present invention to solve the above problems. More specifically, it is an object of the present invention to provide a sensing device which can precisely detect a change in magnetic field without being easily disturbed by external noise. It is another object of the present invention to provide a sensing device which can produce an output signal precisely corresponding to a predefined location (angle) of a moving member of magnetic material.

SUMMARY OF THE INVENTION

According to an aspect of the present invention, there is provided a sensing device including: magnetic field generation means for generating a magnetic field; magnetic field variation inducing means for changing the magnetic field generated by the magnetic field generation means, the magnetic field variation inducing means being disposed a predetermined distance apart from the magnetic field generation means; and giant magnetoresistance device whose resistance changes in response to the change in the magnetic field caused by the magnetic field variation inducing means; a mutual shape or distance between said giant magnetoresistance device, the magnetic field generation means and the magnetic field variation inducing means being set at a predetermined relation. In this arrangement, it becomes possible to achieve high-accuracy and high-efficiency detection of the change in magnetic field smaller protruding or recessed portions, and it is thus possible to improve detection accuracy.

In one form of the invention, the magnetic field variation inducing means is composed of a moving member of magnetic material provided with at least one protruding or recessed portion, the magnetic field generation means is composed of a magnet. According to this arrangement, it becomes possible to detect smaller protruding or recessed portions, and therefore it is possible to realize a small-sized and low-cost sensing device with improved detection accuracy.

In another form of the invention, a size of the magnetic field sensing plane of the giant magnetoresistance device is set to a value less than the smallest value of the dimensions of the protruding and recessed portions of the moving member of magnetic material. According to the above arrangement, it becomes possible to achieve high-accuracy and high-efficiency detection of the change in magnetic field smaller protruding or recessed portions, and it is thus possible to further improve detection accuracy.

In a further form of the invention, a size of the magnet is set to a value less than five times the smallest value of the dimensions of the protruding and recessed portions of the moving member of magnetic material. According to the above arrangement, it becomes possible to achieve high-accuracy and high-efficiency detection of the change in magnetic field smaller protruding or recessed portions, and it is thus possible to further improve detection accuracy.

In a still further form of the invention, a distance between the giant magnetoresistance device and the magnet is set to a value less than five times the size of the magnetic field sensing plane of the giant magnetoresistance device. According to the above arrangement, it becomes possible to achieve high-accuracy and high-efficiency detection of the change in magnetic field smaller protruding or recessed portions, and it is thus possible to further improve detection accuracy.

In a yet further form of the invention, the sensing device further comprises a bridge circuit having at least one branch composed of the giant magnetoresistance device; and signal processing means for processing the signal output by the bridge circuit, whereby edges of the protruding and recessed portions of said moving member of magnetic material are detected. According to the above arrangement, it becomes possible to achieve high-accuracy and high-efficiency detection of the change in magnetic field, and it is thus possible to further improve detection accuracy. Furthermore, according to the above arrangement, since the anisotropy in sensitivity of the magnetic field sensing plane of the giant magnetoresistance devices is eliminated, it thus becomes possible to perform reliable detection of the change in the magnetic field. Furthermore, since great changes in resistances of the giant magnetoresistance devices can be obtained, it is thus possible to obtain a correspondingly great signal at the output of the signal processing means, which gives a great margin to the signal with respect to the reference level in the conversion operation performed by the signal processing means. this serves to increase the resistance to external noise and thus ensuring that the signal processing means can output a more reliable output signal with a "0" or "1" level.

In still another form of the invention, the moving member of magnetic material is a rotary member which rotates in synchronization with a rotating shaft. This arrangement ensures that the sensing device can precisely detect the change in the magnetic field caused by the rotation of the rotary member of magnetic material.

In still another form of the invention, the sensing device includes a main part of the sensing device provided with the giant magnetoresistance device, the rotary member being mounted on a crank shaft or a cam shaft of an internal combustion engine, the main part of the sensing device being disposed adjacent to the internal combustion engine so that the rotary member faces the giant magnetoresistance device. This arrangement makes it possible to achieve a small-sized and high-precision sensing device which can precisely detect the rotation angle (rotation speed) of the crank shaft or the cam shaft of an internal combustion engine. As a result, it becomes possible to precisely control the internal combustion engine. Furthermore, the sensing device can be easily mounted in a highly reliable fashion on an internal combustion engine without requiring a large mounting space.

In still another form of the invention, the main part of the detecting apparatus is disposed at a location away from the rotary member in a direction along the axis of the rotating shaft. In this arrangement, the space near the rotating shaft can be effectively utilized to install the main part of the sensing device. This means that no additional space in a radial direction is required to install the main part of the sensing device, and therefore it is possible to further reduce the size of the sensing device.

In still another form of the invention, the main part of the detecting apparatus includes a housing in which the giant magnetoresistance device is disposed, and the rotary member is disposed in a space on a side of the housing in such a manner that at least the periphery of the rotary member faces the giant magnetoresistance device. In this arrangement, a magnetic path is formed through the rotary member and the giant magnetoresistance device. Therefore, this structure has, in effect, the same function as the rotary member of magnetic material at least a part of which is formed of a magnet. As a result, in this structure, it becomes possible to start providing a correct out put signal precisely corresponding to the rotation angle of the rotary member as soon as the power of the sensing device is turned on.

DESCRIPTION OF THE PREFERRED EMBODIMENTS

With reference to preferred embodiments, the sensing device according to the present invention will be described in greater detail below in connection with the accompanying drawings.

Embodiment 1

Figure 1A:
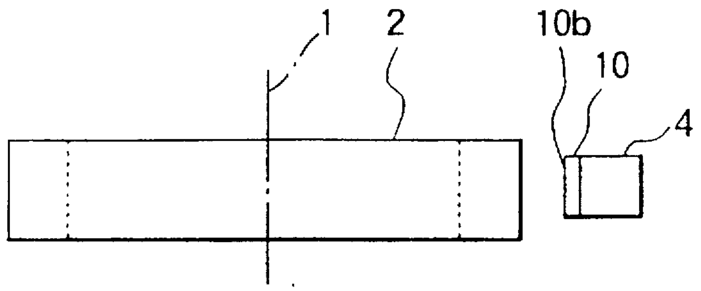
FIGS. 1(*a*) and 1(*b*) are schematic diagrams illustrating a first embodiment of a sensing device according to the present invention.
Figure 1B:
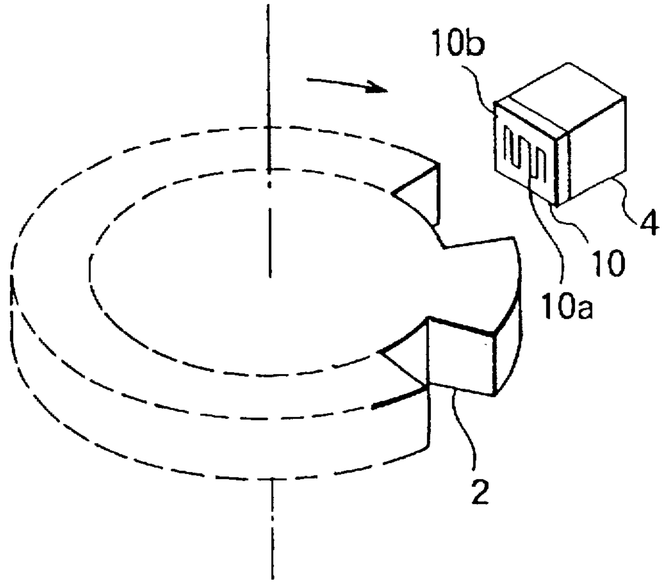

FIG. 1 is a schematic diagram illustrating a first embodiment of a sensing device according to the present invention, wherein FIGS. 1*a* and 1*b* are a side view and a perspective view thereof, respectively.

The sensing device includes: a rotating shaft 1; a rotary member of magnetic material 2 serving as magnetic field variation inducing means, the rotary member of magnetic material 2 having at least one protruding or recessed portion, the rotary member of magnetic material 2 being adapted to rotate in synchronization with the rotation of the rotating shaft 1; a magnetic field sensing element, for example, a giant magnetoresistance device 10 disposed in a radial direction from the rotary member of magnetic material 2 at a location a predetermined distance apart from the rotary member of magnetic material 2; and a magnet 4 serving as magnetic field generating means for supplying a magnetic field to the giant magnetoresistance device 10, wherein the giant magnetoresistance device 10 includes a magnetoresistance pattern 10*a* serving as a magnetic field sensing pattern and a thin film plane (magnetic field sensing plane) 10*b*.

If the rotary member of magnetic material 2 rotates, the magnetic field applied to the magnetic field sensing plane 10*b* of the giant magnetoresistance device 10 changes, and thus the resistance of the magnetoresistance pattern 10*a* changes correspondingly.

In this sensing device, the giant magnetoresistance device 10 has a multilayer structure consisting of alternately grown magnetic layers and non-magnetic layers each having a thickness in the range from a few Å to a few tens of Å. Such a multilayer structure is known as the superlattice structure, and a specific example is disclosed in a paper entitled "Magnetoresistance effect of multilayers" published in the Journal of Magnetics Society of Japan, Vol. 15, No. 51991, pp. 813 to 821. Specific structures includes (Fe/Cr)n, (permalloy/Cu/Co/Cu)n, (Co/Cu)n, etc. These superlattice structures exhibit much greater magnetoresistance effect (giant magnetoresistance effect) than conventional magnetoresistance devices. In these giant magnetoresistance devices with a superlattice structure, the magnetoresistance effect depends only on the relative angle between magnetization of adjacent magnetic layers, and therefore the change in resistance does not depend on the direction of the external magnetic field applied with respect to the direction of current (this property is referred to as "in-plane magnetic field sensitivity".

In view of the above, in the present invention, the magnetic field sensing plane for detecting the change in the magnetic field is formed substantially with giant magnetoresistance devices 10 wherein electrodes are formed so that the respective giant magnetoresistance devices are connected in such a manner as to form a bridge circuit. Two opposite nodes of the bridge circuit are connected to a constant voltage source or a constant current source so that the change in resistance of the giant magnetoresistance devices 10 is converted into the change in voltage thereby detecting the change in the magnetic field applied to the giant magnetoresistance devices 10.

Figure 2:
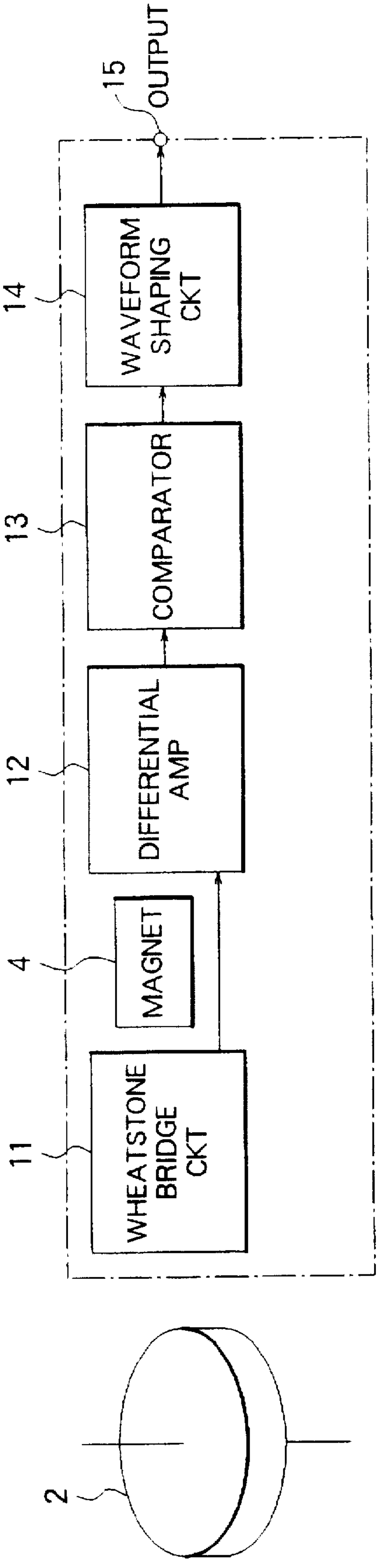
FIG. 2 is a block diagram illustrating the circuit configuration of the first embodiment of the sensing device according to the present invention.

FIG. 2 is a block diagram illustrating the construction of the sensing device using the giant magnetoresistance devices described above.

The sensing device includes: a Wheatstone bridge circuit 11 including giant magnetoresistance devices disposed a predetermined distance apart from the rotary member of magnetic material 2 so that a magnetic field is applied from a magnet 4 to the giant magnetoresistance devices; a differential amplifier 12 for amplifying the output signal of the Wheatstone bridge circuit 11; a comparator 13 for comparing the output of the differential amplifier 12 with a reference value and outputting a "0" signal or a "1" signal depending on the comparison result; a waveform shaping circuit 14 for shaping the waveform of the output of the comparator 13 and supplying a "0" or "1" signal having sharp rising and falling edges to the output terminal 15. The above differential amplifier 12, comparator 13, and waveform shaping circuit 14 form signal processing means.

Figure 3:
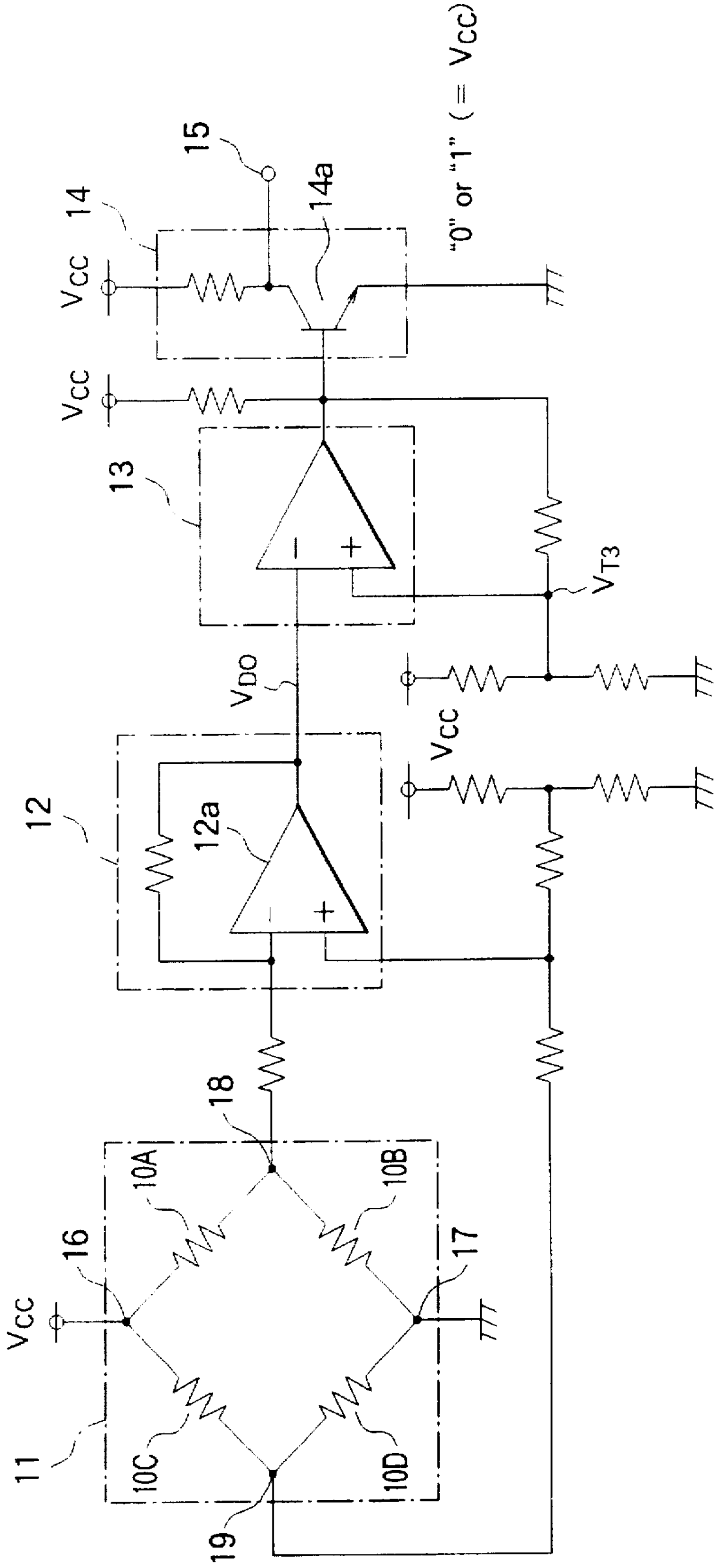
FIG. 3 is a circuit diagram illustrating a specific example of the circuit of FIG. 2.

FIG. 3 is a circuit diagram illustrating a specific example of the circuit shown in FIG. 2.

The Wheatstone bridge circuit 11 includes branches 10A, 10B, 10C, and 10D which are each formed with a giant magnetoresistance device. One end of the giant magnetoresistance device 10A and one end of the giant magnetoresistance device 10C are connected in common to each other, and the node 16 between these devices 10A and 10C is connected to the power supply terminal Vcc. One end of the giant magnetoresistance device 10B and one end of the giant magnetoresistance device 10D are connected in common to each other, and the node 17 between these devices 10B and 10D is grounded. The other ends of the giant magnetoresistance devices 10A and 10B are connected to a node 18, while the other ends of the giant magnetoresistance devices 10C and 10D are connected to a node 19.

The node 18 of the Wheatstone bridge circuit 11 is connected, via a resistor, to the inverting input of the amplifier 12*a* constituting the differential amplifier 12. The node 19 is connected, via a resistor, to the non-inverting input of the amplifier 12*a* wherein the non-inverting input of the amplifier 12*a* is further connected, via a resistor, to a voltage divider constituting a reference power supply.

The output terminal of the amplifier 12*a* is connected to the inverting input terminal of the comparator 13. The non-inverting input terminal of the comparator 13 is connected to a voltage divider constituting a reference power supply which is composed of resistors 21 and 22, and also connected via a resistor to the output terminal of the comparator 13.

The output of the comparator 13 is also connected to the base of a transistor 14*a*. The collector of the transistor 14*a* is connected to the output terminal 15 and also to a power supply terminal Vcc via a resistor. The emitter of the transistor 14*a* is grounded.

Figure 4:
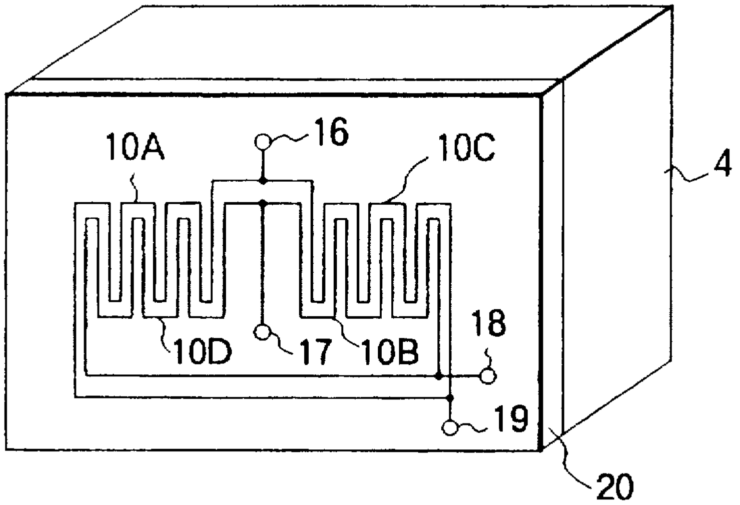
FIG. 4 is a schematic diagram illustrating four GMR devices formed on a structure, wherein those four GMR devices constitute the Wheatstone bridge circuit in the circuit shown in FIG. 3.

FIG. 4 is a schematic diagram illustrating giant magnetoresistance devices 10A, 10B, 10C, and 10D which are formed on a substrate 20 so that a Wheatstone bridge circuit 11 is constructed by those devices.

Figure 5:
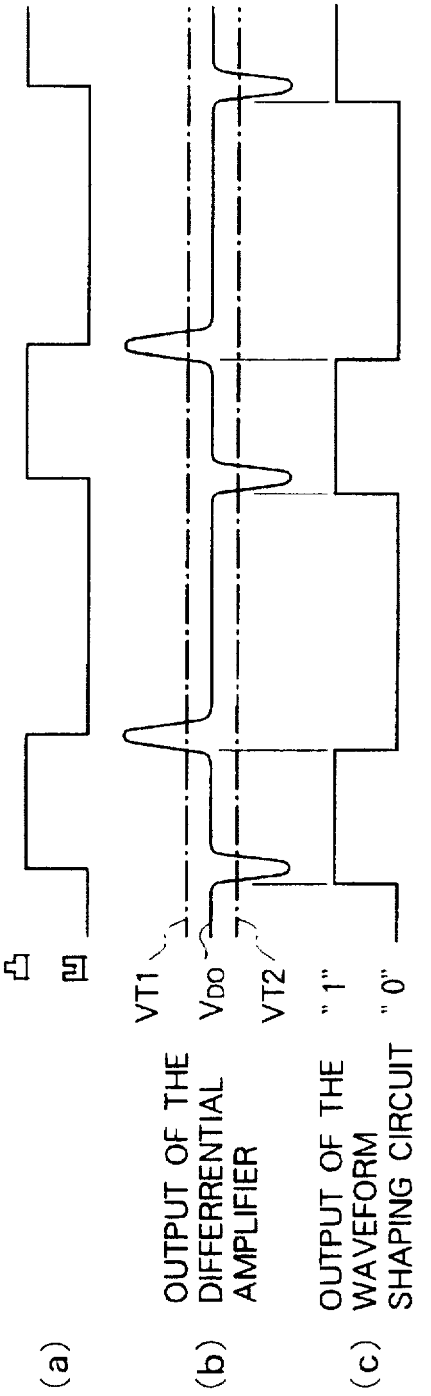
FIG. 5 is a waveform diagram illustrating the operation relating to FIG. 3.

The operation will be firstly described below with reference to FIG. 5.

If the rotary member of magnetic material 2 rotates, the magnetic field applied to the giant magnetoresistance devices 10A to 10D changes in response to the passage of the protruding and recessed portions of the rotary member of magnetic material 2 as shown in FIG. 5*a*, wherein the magnetic field applied to the magnetoresistance devices 10A and 10D is, in effect, opposite in phase to that applied to the magnetoresistance devices 10B and 10C. The above change in the magnetic field is detected by the magnetoresistance devices 10A and 10D, and also by the magnetoresistance devices 10B and 10C wherein the phase of the magnetic field detected by the magnetoresistance devices 10A and 10D becomes opposite to that detected by the magnetoresistance devices 10B and 10C. As a result, the overall magnitude of the change in the magnetic field becomes, in effect, four times greater than that which can be sensed by a single giant magnetoresistance device.

A corresponding change in resistance occurs in each giant magnetoresistance device. Thus, the giant magnetoresistance devices 10A and 10D have maximum and minimum resistances at locations opposite in phase to those where the giant magnetoresistance elements 10B and 10C have maximum and minimum resistances. As a result, the voltages at the nodes 18 and 19 (mid-point voltages) of the Wheatstone bridge circuit 11 also change in a similar fashion.

The difference in the mid-point voltage is amplified by the differential amplifier 12. As shown in FIG. 5*b*, the differential amplifier 12 outputs a signal $V_{DO}$ corresponding to the protruding and recessed portions of rotating member 2 of magnetic material shown in FIG. 5*a*. Thus, the output signal of the differential amplifier 12 is substantially four times greater than that obtained by a single GMR device.

The output $V_{DO}$ of this differential amplifier 12 is applied to the comparator 13 so as to make comparison with the reference voltage. The comparator 13 outputs a "0" or "1" signal in accordance with the comparison result. The waveform of this signal is then shaped by the waveform shaping circuit 14. As a result, an output signal having a "0" or "1" level with sharp rising and falling edges is provided via the output terminal 15 as shown in FIG. 5*c*.

With the configuration described above, the difference between the mid-point voltages is amplified in a differential fashion, and the change in the magnetic field detected by the respective magnetoresistance devices is effectively enhanced to a level four times greater than can be obtained by a single magnetoresistance device. That is, the configuration using the bridge circuit can provide a reliable means for converting the change in the magnetic field caused by the rotation of the rotary member of magnetic material 2 into a great change in resistance.

Thus it is possible to obtain a correspondingly great signal at the output of the differential amplifier 12, which gives a great margin to the signal with respect to the reference level in the comparison operation performed by the comparator 13 thereby increasing the resistance to disturbance due to external noise and thus ensuring that the comparator can output a more reliable output signal with a "0" or "1" level.

Figure 6:
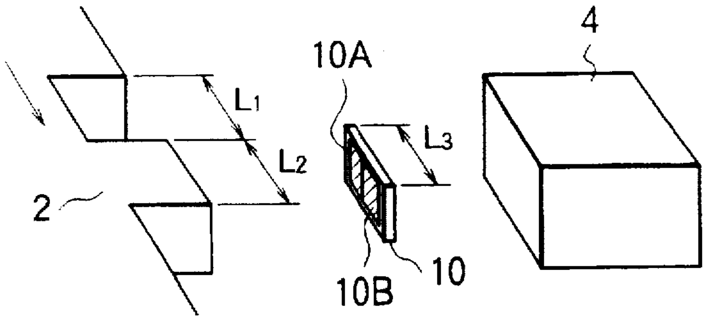
FIG. 6 is a schematic diagram illustrating a subject matter of the first embodiment of a sensing device according to the present invention.

In the above structure, if dimensions of elements are selected such that $L_3 \leqq L_1$ and $L_3 \leqq L_2$ where $L_1$ and $L_2$ denotes, as shown in FIG. 6, the sizes of the recessed portions and protruding portions, respectively, of the rotating member 2 of magnetic material, and $L_3$ denotes the size of the magnetic field sensing plane of the GMR device 10, then the GMR device 10 can efficiently detect the change in the magnetic field corresponding to the protruding and recessed portions of the rotating member 2 of magnetic material. As a result, it is possible to obtain a precise detection signal with high reliability.

Figure 7:
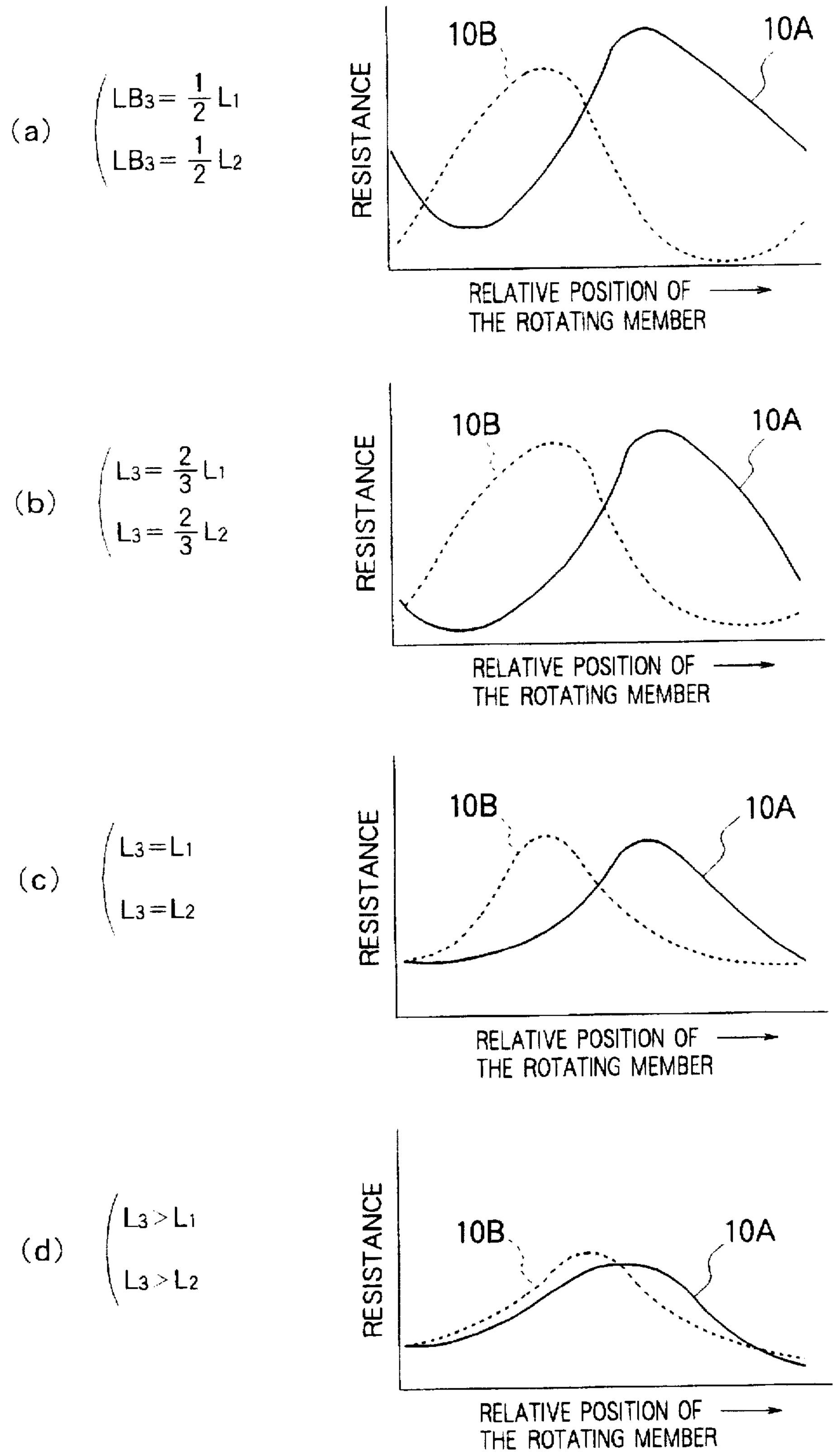
FIG. 7 is a characteristic diagram illustrating the subject matter of the first embodiment of a sensing device according to the present invention.

FIG. 7 illustrates examples of resistance changes of the GMR devices 10A and 10B constituting the bridge circuit shown in FIG. 3, for four different conditions in terms of the size $L_3$ of the magnetic field sensing plane of the GMR device 10 and the sizes $L_1$, $L_2$ of the protruding and recessed portions of the rotating member 2 of magnetic material.

As can be seen from FIG. 7, in the case where the changes in the resistances of the GMR devices 10A and 10B are great and the GMR device 10B has a minimum resistance when the GMR device 10A has a maximum resistance, or otherwise the GMR device 10B has a maximum resistance when the GMR device 10A has a minimum resistance, a maximum efficiency is obtained in detection of the protruding and recessed portions of the rotating member 2 of magnetic material.

It can also be seen from FIG. 7 that high efficiency detection is possible when the above-described conditions $L_3 \leqq L_1$, $L_3 \leqq L_2$ are satisfied.

Of the above four examples, in the case of FIG. 7*a* in which $L_3=L_1/2$ and $L_3=L_2/2$, there is no symmetry in the resistance change between the GMR devices 10A and 10B, although a great change in resistance is obtained. On the other hand, in the case of FIG. 7*b* in which $L_3=L_1\cdot(2/3)$ and $L_3=L_2\cdot(2/3)$, not only a great change in resistance but also good symmetry in resistance change is obtained. In the case of FIG. 7*c* in which $L_3=L_1$ and $L_3=L_2$, a great change in resistance is not obtained although there is good symmetry in the resistance change. In the case of FIG. 7*d* in which $L_3>L_1$ and $L_3>L_2$, neither a great change in resistance nor good symmetry in the resistance change is obtained.

As described above, it is possible to optimize the dimensions of the GMR devices relative to the dimensions of the protruding and recessed portions of the rotating member of magnetic material. In other words, it is possible to maximize the detection efficiency by optimizing the dimensions of the magnetic field sensing plane of the GMR devices relative to the dimensions of the protruding and recessed portions of the rotating member of magnetic material (in the specific examples described above, the conditions shown in FIG. 7*b* result in the best characteristic).

Although the Wheatstone bridge circuit constructed with GMR devices is employed in this specific embodiment, other similar bridge circuit configurations may also be employed.

In this embodiment, as described above, high-accuracy and high-efficiency detection of the change in magnetic field is achieved by optimizing the dimensions of the magnetic field sensing plane of the GMR devices relative to the dimensions of the protruding and recessed portions of the rotating member of magnetic material.

Furthermore, the edges of the protruding and recessed portions of the rotating member of magnetic material can be detected precisely via the bridge circuit constructed with GMR devices. This makes it possible to achieve greater accuracy in the final output signal.

Embodiment 2

Figure 8:
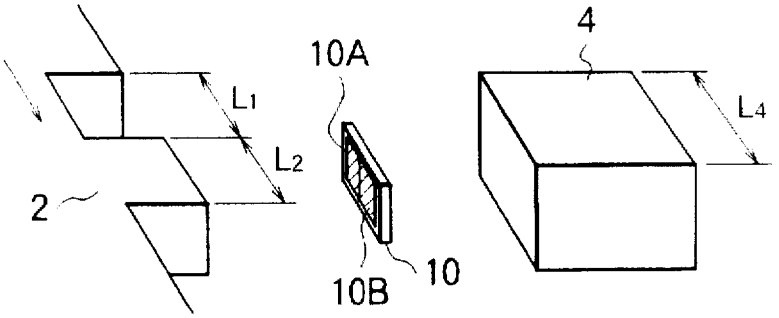
FIG. 8 is a schematic diagram illustrating a subject matter of a second embodiment of a sensing device according to the present invention.

FIG. 8 is a schematic diagram illustrating a second embodiment according to the present invention.

In this figure, similar elements and parts to those in FIG. 6 are denoted by similar reference numerals, and they are not described here in further detail. Furthermore, in the present embodiment, the overall structure, the geometrical structure of GMR devices disposed on a substrate, and the circuit configuration including the Wheatstone bridge circuit are similar to those employed in the first embodiment described above, and thus they are not described here in further detail.

In the first embodiment described above, high accuracy and high efficiency in the detection of magnetic field are achieved by limiting the dimensions of the magnetic field sensing plane of the GMR devices within the specific range relative to the dimensions of the protruding and recessed portions of the rotating member of magnetic material. In contrast, in the present embodiment, the dimension of the magnet relative to the dimensions of the protruding and recessed portions of the rotating member of magnetic material is limited within an optimum range.

That is, if the magnet has a size $L_4$ satisfying the conditions $L_4 \leqq 5L_1$ and $L4 \leqq 5L_2$, then it is possible to achieve high efficiency in the detection of the protruding and recessed portions of the rotating member of magnetic material.

Figure 9:
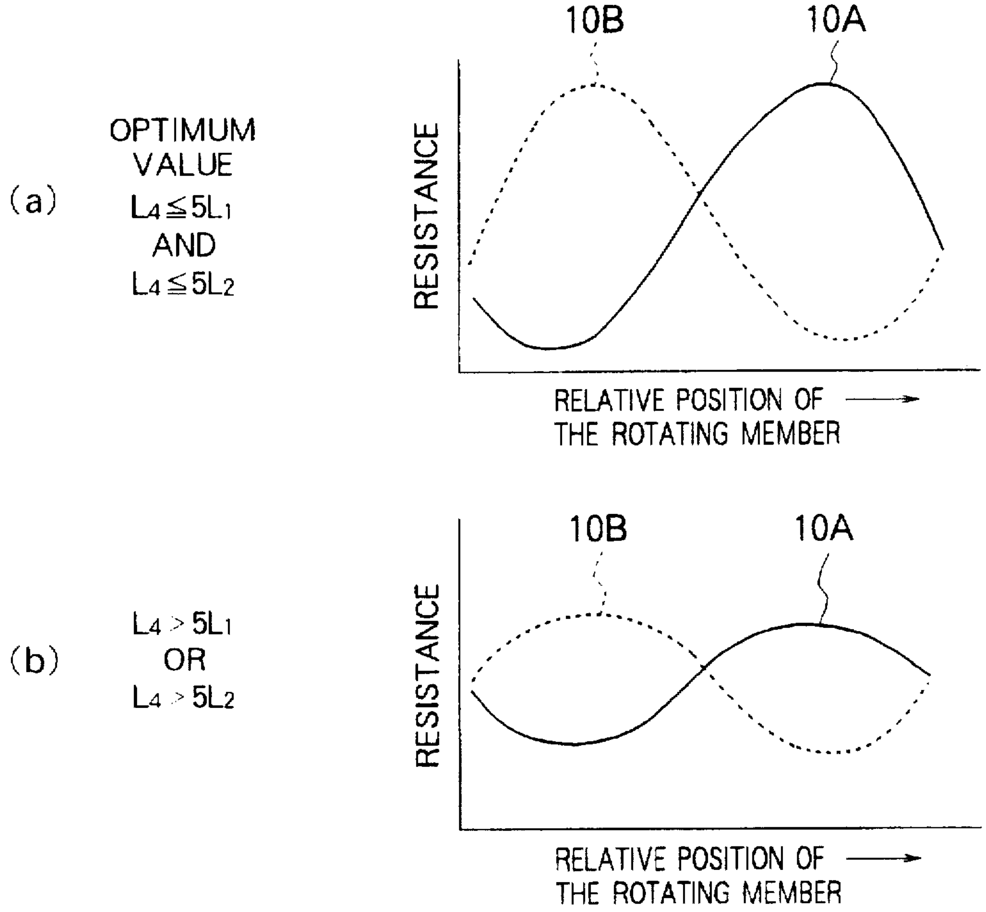
FIG. 9 is a characteristic diagram illustrating the subject matter of the second embodiment of a sensing device according to the present invention.

FIG. 9 illustrates examples of resistance changes of the GMR devices 10A and 10B constituting the bridge circuit shown in FIG. 3, for two different conditions in terms of the size $L_4$ of the magnet relative to the sizes $L_1$, $L_2$ of the protruding and recessed portions of the rotating member 2 of magnetic material.

Also in this case, when the changes in the resistances of the GMR devices 10A and 10B are great and the GMR device 10B has a minimum resistance when the GMR device 10A has a maximum resistance, or otherwise the GMR device 10B has a maximum resistance when the GMR device 10A has a minimum resistance, a maximum efficiency is obtained in detection of the protruding and recessed portions of the rotating member 2 of magnetic material.

More specifically, as can be seen from FIG. 9, the above requirements are satisfied when $L_4 \leqq 5L_1$ and $L_4 \leqq 5L_2$.

That is, in the case of FIG. 9*a* in which $L_4 \leqq 5L_1$ and $L_4 \leqq 5L_2$, not only a great change in resistance but also good symmetry in resistance change is obtained. On the other hand, in the case of FIG. 9*b* in which $L_4 > 5L_1$ and $L_4 > 5L_2$, the change in resistance is small although there is good symmetry in the resistance change.

As described above, the detection efficiency can be maximized by optimizing the size of the magnet relative to the dimensions of the protruding and recessed portions of the rotating member of magnetic material. (in the specific examples described above, the conditions shown in FIG. 9*a* lead to the best result).

Although the Wheatstone bridge circuit constructed with GMR devices is employed in this specific embodiment, other similar bridge circuit configurations may also be employed.

Thus, high accuracy and high efficiency in the detection of the change in the magnetic field can be achieved by optimizing the size of the magnet relative to the dimensions of the protruding and recessed portions of the rotating member of magnetic material.

Furthermore, the edges of the protruding and recessed portions of the rotating member of magnetic material can be detected precisely via the bridge circuit constructed with GMR devices. This makes it possible to achieve greater accuracy in the final output signal.

Embodiment 3

Figure 10:
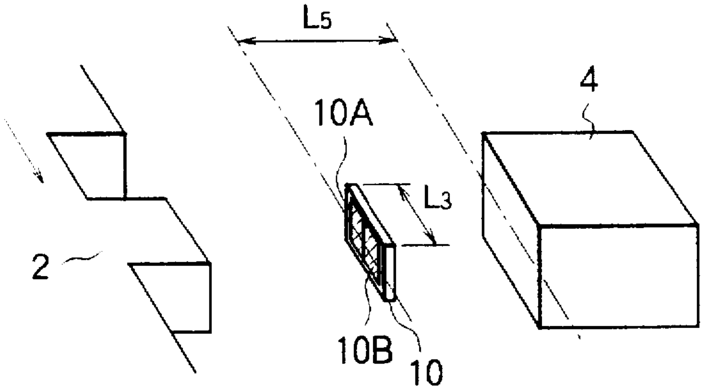
FIG. 10 is a schematic diagram illustrating a subject matter of a third embodiment of a sensing device according to the present invention.

FIG. 10 is a schematic diagram illustrating a third embodiment according to the present invention.

In this figure, similar elements and parts to those in FIG. 6 are denoted by similar reference numerals, and they are not described here in further detail. Furthermore, in the present embodiment, the overall structure, the geometrical structure of GMR devices disposed on a substrate, and the circuit configuration including the Wheatstone bridge circuit are similar to those employed in the first embodiment described above, and thus they are not described here in further detail.

In the first and second embodiments described above, high accuracy and high efficiency in the detection of magnetic field are achieved by optimizing the size of the magnet or the dimensions of the magnetic field sensing plane of the GMR devices relative to the dimensions of the protruding and recessed portions of the rotating member of magnetic material. In contrast, in the present embodiment, the location of the magnet relative to the field sensing plane of the GMR device is optimized.

That is, the distance $L_5$ between the magnet and the magnetic field sensing plane is set such that $L_5 \leqq 5L_3$, then it is possible to achieve high efficiency in the detection of the protruding and recessed portions of the rotating member of magnetic material.

Figure 11:
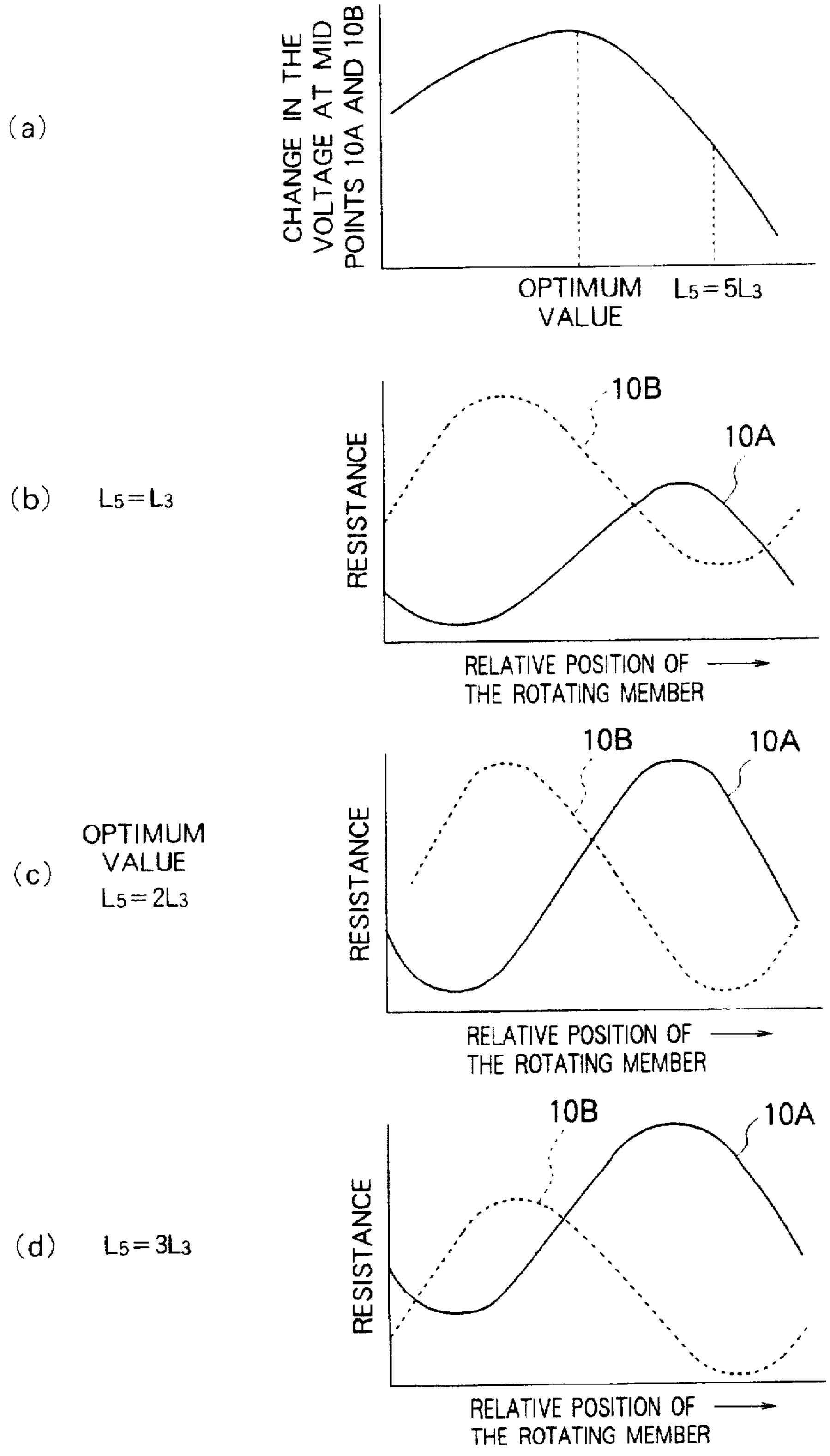
FIG. 11 is a characteristic diagram illustrating the subject matter of the third embodiment of a sensing device according to the present invention.

FIG. 11 illustrates examples of resistance changes of the GMR devices 10A and 10B constituting the bridge circuit shown in FIG. 3, for three different conditions in terms of the size $L_3$ of the magnetic field sensing plane of the GMR device 10 and the distance L5 between the magnet and the magnetic field sensing plane of the GMR device 10.

Also in this case, when the changes in the resistances of the GMR devices 10A and 10B are great and the GMR device 10B has a minimum resistance when the GMR device 10A has a maximum resistance, or otherwise the GMR device 10B has a maximum resistance when the GMR device 10A has a minimum resistance, a maximum efficiency is obtained in detection of the protruding and recessed portions of the rotating member 2 of magnetic material.

More specifically, as can be seen from FIG. 11*a*, the above requirements are satisfied when $L_5 \leqq 5L_3$.

Of the above examples, in the case of FIG. 11*b* in which $L_5 = L_3$, there is no symmetry in the resistance change although a great change in resistance is obtained. On the other hand, in the case of FIG. 11*c* in which $L_5 = 2L_3$, not only a great change in resistance but also good symmetry in resistance change is obtained. In the case of FIG. 11*d* in which $L_5 = 3L_3$, there is no symmetry in the resistance change although a great change in resistance is obtained.

As described above, the detection efficiency can be maximized by optimizing the distance between the magnet and the magnetic field sensing plane of the GMR device within the range $L_5 \leqq 5L_3$ (in the specific examples described above, the conditions shown in FIG. 11*c* lead to the best result).

Although the Wheatstone bridge circuit constructed with GMR devices is employed in this specific embodiment, other similar bridge circuit configurations may also be employed.

In this embodiment, as described above, high-accuracy and high-efficiency detection of the change in magnetic field is achieved by optimizing the distance between the magnet and the magnetic field sensing plane of the GMR device.

Furthermore, the edges of the protruding and recessed portions of the rotating member of magnetic material can be detected precisely via the bridge circuit constructed with GMR devices. This makes it possible to achieve greater accuracy in the final output signal.

Embodiment 4

Figure 12:
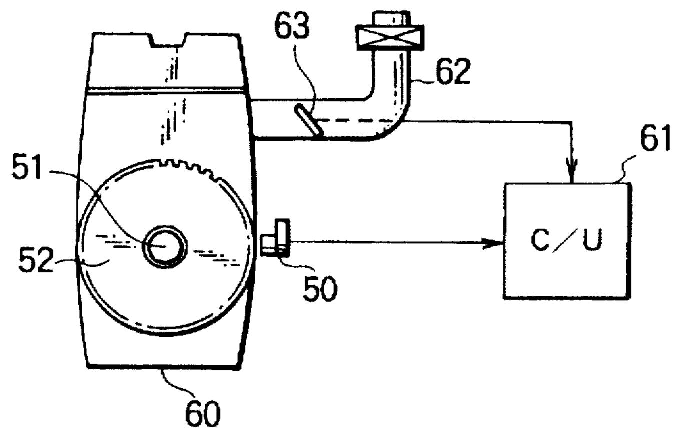
FIG. 12 is a schematic diagram illustrating a fourth embodiment of a sensing device according to the present invention.
Figure 13:
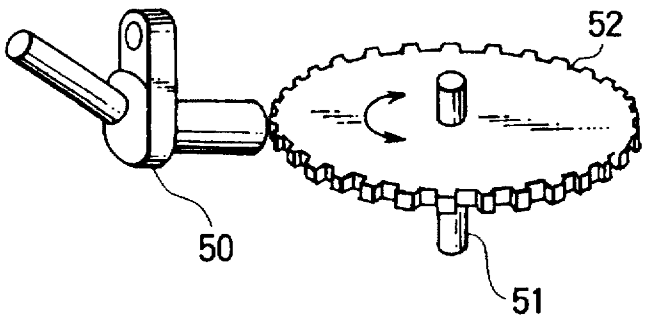
FIG. 13 is a perspective view illustrating the relative positions of the main part of the sensing device and a rotary member of magnetic material in the fourth embodiment according to the present invention.
Figure 14:
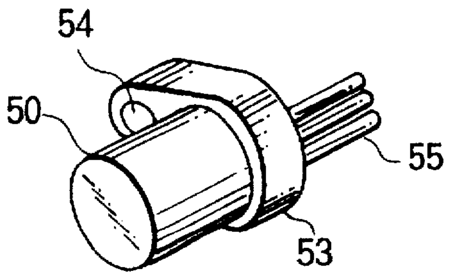
FIG. 14 is a perspective view illustrating the main part of the sensing device of the fourth embodiment according to the present invention.
Figure 15:
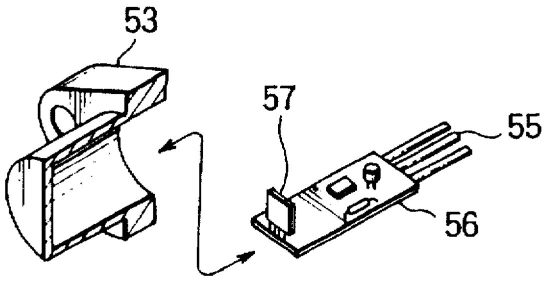
FIG. 15 is an exploded view illustrating the internal structure of the main part of the sensing device of the fourth embodiment according to the present invention.

FIGS. 12 to 15 illustrate fourth embodiment of the invention, in which the invention is applied to an internal combustion engine. FIG. 12 is a schematic diagram illustrating the construction of the entire system of the embodiment. FIG. 13 is a perspective view illustrating the relative positions of the main part of a sensing device and a rotary member of magnetic material. FIG. 14 is a perspective view illustrating the main part of the sensing device, and FIG. 15 illustrates the internal structure thereof. As shown in these figures, the main part of the sensing device 50 is disposed at a location adjacent to the internal combustion engine 60. A rotary member of magnetic material 52 serving as a signal plate is disposed on a crank shaft or a cam shaft of the engine 60 serving as a rotation shaft 51 so that the rotary member of magnetic material 52 can rotate in synchronization with the rotation shaft 51 wherein the rotary member of magnetic material 52 has at least one protruding or recessed portion as in the above-descried rotary member of magnetic material 2.

A control unit 61 is connected to a circuit unit of the main part of the sensing device 50. The control unit 61 is also connected to a throttle valve disposed in the intake manifold 62 of the internal combustion engine 60.

The main part of the sensing device 50 is disposed near the internal combustion engine 60 in such a manner that the magnetic field sensing plane of the giant magnetoresistance devices of the main part of the sensing device 50 faces the rotary member of magnetic material 52.

As shown in FIG. 14, the main part of the sensing device 50 includes: a housing 53 made up of resin or a non-magnetic material; an attachment part 54; and input/output lead terminals 55 such as a power supply terminal, a ground terminal, and an output terminal, extending from the bottom portion of the housing 53.

As shown in FIG. 15, inside the housing 53 is a substrate 56 on which a circuit such as that described earlier with reference to FIG. 3 is disposed. On the substrate 56, there is also provided giant magnetoresistance devices 57 and a magnet 58 similar to for example the above-described giant magnetoresistance device 10 and magnet 4, respectively.

The operation will be described below.

When the internal combustion engine 60 is started and the rotary member of magnetic material 52 thus starts to rotate in synchronization with the rotation of the rotating shaft 51, the magnetic field applied to the magnetic field sensing plane of the giant magnetoresistance devices 57 of the main part of the sensing device 50 changes in response to the protruding and recessed portions, and a corresponding change occurs in the resistance of the giant magnetoresistance devices 57. As a result the voltage difference between the mid-point voltages of a Wheatstone bridge circuit including the giant magnetoresistance devices 57 changes correspondingly. The voltage difference is amplified by a differential amplifier, and the output signal of the differential amplifier is supplied to a comparator which in turn compares the output signal of the differential amplifier with a reference voltage and outputs a "0" or "1" signal in response to the comparison result. The output signal of the comparator is then shaped by a waveform shaping circuit. The resultant signal having a "0" or "1" level is supplied to the control unit 61. From this signal, the control unit 61 can acquire the information about the rotation angle and the rotation speed of the crank shaft and the cam shaft in relation to each cylinder of the internal combustion engine 60.

On the basis of the output signal of the sensing device, which has either a "0" or a "1" level, and also on the basis of the information about the opening ratio of the throttle valve 63, the control unit 61 generates control signals by which the ignition timing of ignition plugs (not shown) and the injection timing of the fuel injection valves are controlled.

Figure 16:
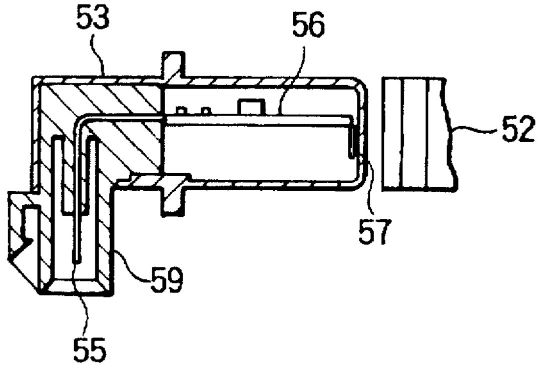
FIG. 16 is a sectional side view illustrating a modified example of the main part of the sensing device based on the fourth embodiment of the invention.

Although, in the specific example described above, the main part of the sensing device 50 has input/output terminals 55 in the form of leads, a connector 59 such as that shown in FIG. 16 which can be attached in a removable fashion to the housing 53 may also be employed.

In this case, the terminals 55 are incorporated in the connector 59 so that when the connector 59 is fitted into the housing 53 the terminals 55 come in contact with the circuit disposed on the substrate 56. This connector 59 makes it easy to handle the sensing device with a simple mechanism, and also makes it easy to mount the sensing device on an internal combustion engine.

As described above, the present embodiment provides a small-sized and high-precision sensing device which can precisely detect the rotation angle (rotation speed) of the crank shaft or the cam shaft of an internal combustion engine. This makes it possible to precisely control the internal combustion engine. Furthermore, the sensing device of the present embodiment can be easily mounted in a highly reliable fashion on an internal combustion engine without requiring a large mounting space.

Embodiment 5

Figure 17:
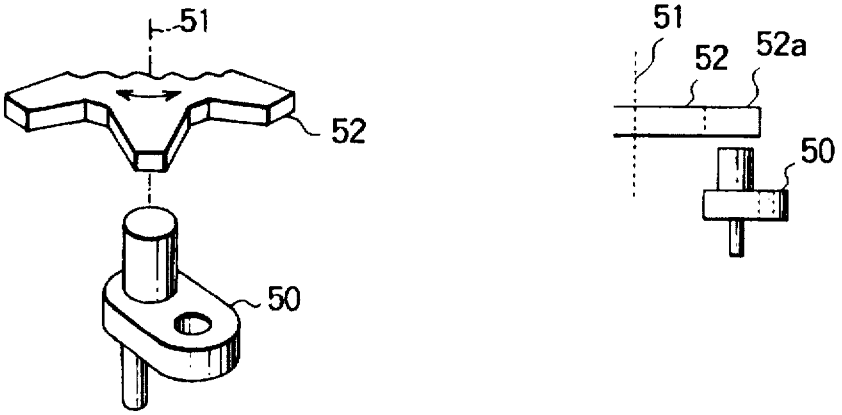
FIG. 17 is a schematic diagram illustrating an fifth embodiment of a sensing device according to the present invention.

FIG. 17 illustrate a fifth embodiment of the present invention, wherein FIG. 17*a* is a perspective view illustrating the relative positions of the main part of a sensing device and a rotary member of magnetic material, and FIG. 17*b* is a side view thereof. In FIG. 17, similar elements and parts to those in FIG. 13 are denoted by similar reference numerals, and they are not described here in further detail.

In all the previous embodiments, the main part of the sensing device is disposed in a position perpendicular to the rotating axis. In contrast, in this tenth embodiment, the main part of the sensing device is disposed in a position parallel to the rotating axis.

That is, as shown in FIG. 17, the main part of the sensing device 50 is shifted in a direction along the rotating axis 51 so that the magnetic field sensing plane of the giant magnetoresistance device of the main part of the sensing device 50 faces the protruding and recessed portions 52*a* of the rotary member of magnetic material 52.

The present embodiment provides not only similar effects to those in the fourth embodiment described above, but also an additional advantage that the space near the rotating shaft can be effectively utilized in disposing the main part of the sensing device. In this arrangement, no additional space in a radial direction is required to install the main part of the sensing device, and therefore it is possible to further reduce the size of the sensing device.

Embodiment 6

Figure 18:
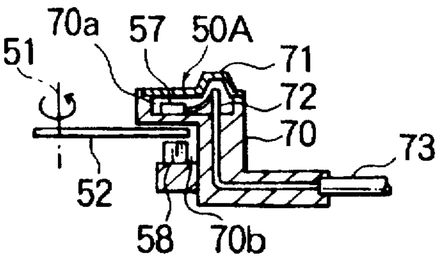
FIG. 18 is a sectional side view illustrating a sixth embodiment of a sensing device according to the present invention.
Figure 19:
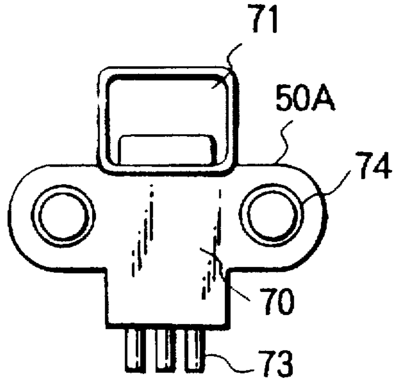
FIG. 19 is a perspective view illustrating the main part of the sensing device of the sixth embodiment according to the present invention.
Figure 20:
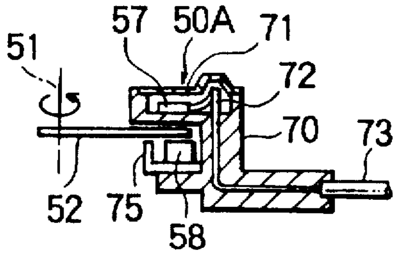
FIG. 20 is a sectional side view illustrating a modified example of the main part of the sensing device based on the sixth embodiment of the invention.
Figure 21A:
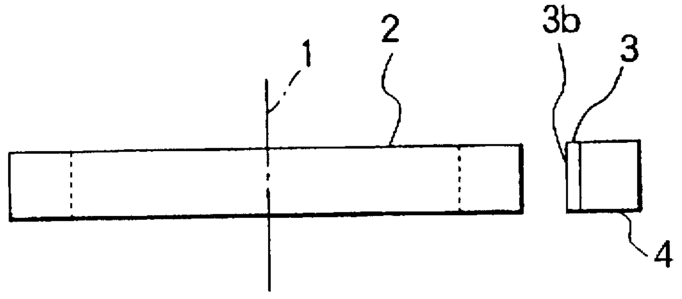
FIGS. 21(*a*) and 21(*b*) are schematic diagrams illustrating a conventional sensing device.
Figure 21B:
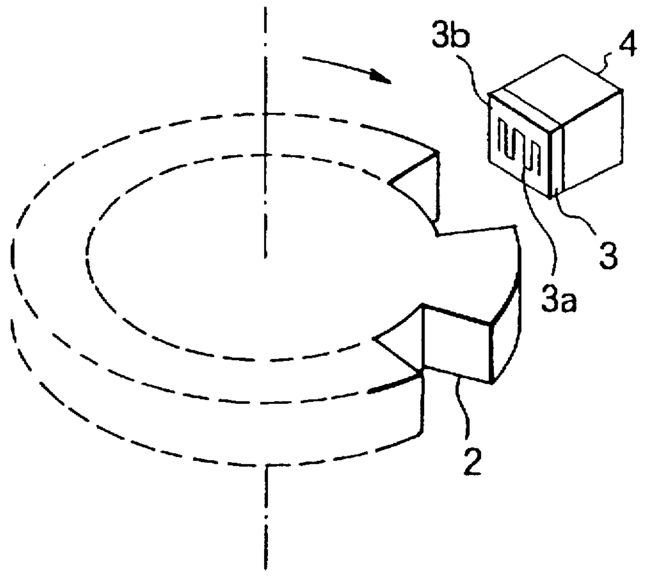
Figure 22:
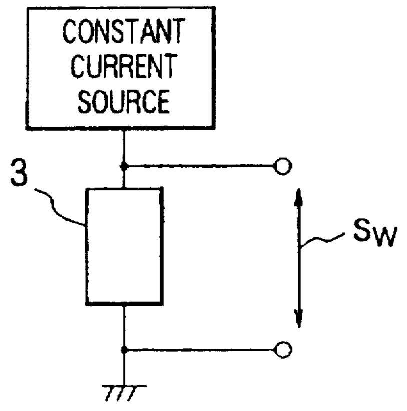
FIG. 22 is a simplified circuit diagram of the conventional sensing device.

FIGS. 18 and 19 illustrate an sixth embodiment of the invention, wherein FIG. 18 is a schematic diagram illustrating the main part of a sensing device and FIG. 19 is a side view thereof.

In these figures, elements and parts similar to those in FIG. 13 or 15 are denoted by similar reference numerals and will not be described here in further detail.

In all previous embodiments, the giant magnetoresistance of the main part of the sensing device is disposed at a predetermined distance apart from the rotary member of magnetic material. In contrast, in this twelfth embodiment, the rotary member of magnetic material is disposed between a magnet and the giant magnetoresistance device of the main part of the sensing device in such a manner that the rotary member of magnetic material is spaced a predetermined distance apart from the magnet and the giant magnetoresistance device.

The main part of the sensing device 50A includes: a housing 70 made up of for example a resin or a non-magnetic material; a cover 71 for protecting a giant magnetoresistance device 57 similar to the above-described giant magnetoresistance device 10, the giant magnetoresistance device 57 being disposed in a cavity 70*a* inside the housing 70; and an attachment part 74. In the cavity 70*a* inside the housing 70, there is provided a substrate (not shown) on which a circuit similar to that described above with reference to FIG. 3 is mounted. The giant magnetoresistance device 57 is mounted on the substrate described above. The giant magnetoresistance device 57 is electrically connected to terminals 72 extending to its bottom portion via the inside of the main part of the sensing device 50A. The other ends of the terminals 72 are connected to input/output lead terminals 73 including a power supply terminal, a ground terminal, and an output terminal, which extend toward the outside for the connection to an external circuit.

A magnet 58 is disposed on the bottom of the space 70*b* on a side of the housing 70 so that the magnet 58 faces the magnetic field sensing plane of the giant magnetoresistance device 57 disposed in the cavity 70*a*. The rotary member of magnetic material 52 which is adapted to rotate in synchronization with the rotating shaft 51 is disposed in such a manner that at least its protruding and recessed portions pass through the gap between the giant magnetoresistance device 57 and the magnet 58.

In this arrangement, a magnetic path is formed through the magnet 58, the rotary member of magnetic material 52, and the giant magnetoresistance device 57. When a recessed portion of the rotary member of magnetic material 52 is located between the giant magnetoresistance device 57 and the magnet 58, the magnetic field emerging from the magnet 58 is applied directly to the magnetic field sensing plane of the giant magnetoresistance device 57. On the other hand, when a protruding portion of the rotary member of magnetic material 52 is located between the giant magnetoresistance device 57 and the magnet 58, the magnetic field emerging from the magnet 58 is absorbed into the rotary member of magnetic material 52, and, as a result, substantially no magnetic field is applied to the magnetic field sensing plane of the giant magnetoresistance device 57.

Therefore the above structure has, in effect, the same function as the rotary member of magnetic material 52 at least a part of which is formed with a magnet as in the embodiments described above in connection with FIGS. 11 and 14. As a result, it is also possible in this structure to start a detecting operation as soon as the electric power is turned on.

In the specific example described above, the magnet 58 is disposed on the bottom of the space 70*b* on the side of the housing 70 so that the magnet 58 faces the magnetic field sensing plane of the giant magnetoresistance device 57 disposed in the cavity 70*a*. However, a core 75 may be further provided between the bottom of the space 70*b* and the magnet 58 as shown in FIG. 29 thereby forming a magnetic circuit. In this case, a closed magnetic path starting from the magnet 58 and passing through the rotary member of magnetic material 52, the giant magnetoresistance device 57, the rotary member of magnetic material 52, the core 75, and finally ending at the magnet 58 is established. This magnetic circuit leads to an improvement in the reliability of the sensing operation.

Thus, the present embodiment not only provides effects similar to those in the fourth embodiment described above, but also provides an additional advantage that it is possible to start a sensing operation as soon as the electric power is turned on even though the rotary member of magnetic material is properly positioned between the giant magnetoresistance device and the magnet.

Embodiment 7

In all the previous embodiments, the moving member of magnetic material serving as the magnetic field variation inducing means is adapted to rotate in synchronization with the rotating shaft. However, the moving member of magnetic material may also be adapted to move along a straight line. Such a moving member can find application for example in the detection of the degree of opening of an EGR valve in an internal combustion engine.

What is claimed is:

1. A sensing device comprising:

magnetic field generation means for generating a magnetic field, said magnetic field generation means including a magnet;

magnetic field variation inducing means for changing the magnetic field generated by said magnetic field generation means, said magnetic field variation inducing means being disposed a predetermined distance apart from said magnetic field generation means, wherein said magnetic field variation inducing means includes a moving member of magnetic material having at least one protruding or recessed portion;

giant magnetoresistance device whose resistance changes in response to the change in the magnetic field caused by said magnetic field variation inducing means, said giant magnetoresistance device including a magnetic field sensing plane;

wherein the size of the magnetic field plane of the giant magnetoresistance device is less than the size of the protruding and recessed portions of the rotating member of magnetic material to maximize detection accuracy of a change in the magnetic field.

2. A sensing device comprising:

magnetic field generation means for generating a magnetic field, said magnetic field generation means including a magnet;

magnetic field variation inducing means for changing the magnetic field generated by said magnetic field generation means, said magnetic field variation inducing means being disposed a predetermined distance apart from said magnetic field generation means, wherein said magnetic field variation inducing means includes a moving member of magnetic material having at least one protruding or recessed portion;

giant magnetoresistance device whose resistance changes in response to the change in the magnetic field caused by said magnetic field variation inducing means, said giant magnetoresistance device including a magnetic field sensing plane;

wherein a size of said magnet is set to a value less than five times the smallest value of the dimensions of the protruding and recessed portions of the moving member of magnetic material to maximize detection accuracy of a change in the magnetic field.

3. A sensing device comprising:

magnetic field generation means for generating a magnetic field, said magnetic field generation means including a magnet;

magnetic field variation inducing means for changing the magnetic field generated by said magnetic field generation means, said magnetic field variation inducing means being disposed a predetermined distance apart from said magnetic field generation means, wherein said magnetic field variation inducing means includes a moving member of magnetic material having at least one protruding or recessed portion;

giant magnetoresistance device whose resistance changes in response to the change in the magnetic field caused by said magnetic field variation inducing means, said giant magnetoresistance device including a magnetic field sensing plane;

wherein a distance between said giant magnetoresistance device and said magnet is set to a value less than five times the size of the magnetic field sensing plane of said giant magnetoresistance device to maximize detection accuracy of a change in the magnetic field.

4. A sensing device according to claim 1, wherein said sensing device further comprises a bridge circuit, at least one branch of said bridge circuit being composed of said giant magnetoresistance device; and signal processing means for processing the signal output by said bridge circuit, said bridge circuit being adapted to detect edges of the protruding and recessed portions of said moving member of magnetic material.

5. A sensing device according to claim 2, wherein said sensing device further comprises a bridge circuit, at least one branch of said bridge circuit being composed of said giant magnetoresistance device; and signal processing means for processing the signal output by said bridge circuit, said bridge circuit being adapted to detect edges of the protruding and recessed portions of said moving member of magnetic material.

6. A sensing device according to claim 3, wherein said sensing device further comprises a bridge circuit, at least one branch of said bridge circuit being composed of said giant magnetoresistance device; and signal processing means for processing the signal output by said bridge circuit, said bridge circuit being adapted to detect edges of the protruding and recessed portions of said moving member of magnetic material.

7. A sensing device according to claim 1, 2, or 3, wherein said moving member of magnetic material is a rotary member which rotates in synchronization with a rotating shaft.

8. A sensing device according to claim 7, including a main part of the sensing device provided with said giant magnetoresistance device, said rotary member being mounted on a crank shaft or a cam shaft in an internal combustion engine, said main part of the sensing device being disposed adjacent to said internal combustion engine so that said rotary member faces said giant magnetoresistance device.

9. A sensing device according to claim 8, wherein said main part of the sensing device is disposed at a location away from said rotary member in a direction along the rotation axis of the rotating shaft.

10. A sensing device according to claim 9, wherein said main part of the sensing device includes a housing in which said giant magnetoresistance device is disposed, and said rotary member is disposed in a space on a side of said housing in such a manner that at least the periphery of said rotary member faces said giant magnetoresistance device.

* * * * *